United States Patent
Xu et al.

(10) Patent No.: US 9,799,688 B2
(45) Date of Patent: Oct. 24, 2017

(54) ARRAY SUBSTRATE WITH UNIFORM CHARGE DISTRIBUTION, METHOD FOR MANUFACTURING THE SAME AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Xiangyang Xu, Beijing (CN); Zhuhua Nie, Beijing (CN); Liyun Deng, Beijing (CN); Minsu Kim, Beijing (CN); Kai Wang, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 51 days.

(21) Appl. No.: 14/361,520

(22) PCT Filed: Jun. 18, 2013

(86) PCT No.: PCT/CN2013/077355
§ 371 (c)(1),
(2) Date: May 29, 2014

(87) PCT Pub. No.: WO2014/172970
PCT Pub. Date: Oct. 30, 2014

(65) Prior Publication Data
US 2015/0137116 A1 May 21, 2015

(30) Foreign Application Priority Data
Apr. 23, 2013 (CN) ...................... 2013 1 0142870 A

(51) Int. Cl.
*H01L 27/12* (2006.01)
*H01L 27/32* (2006.01)
(Continued)

(52) U.S. Cl.
CPC ........ *H01L 27/1296* (2013.01); *G02F 1/1368* (2013.01); *H01L 27/124* (2013.01);
(Continued)

(58) Field of Classification Search
CPC .......................... H01L 27/3248; H01L 27/124
See application file for complete search history.

(56) References Cited

U.S. PATENT DOCUMENTS

2005/0225708 A1* 10/2005 Oke .................. G02F 1/134363
349/139
2005/0257738 A1* 11/2005 Tateishi ................... B41J 3/407
118/300
(Continued)

FOREIGN PATENT DOCUMENTS

| CN | 101211084 A | 7/2008 |
|---|---|---|
| CN | 101944535 A | 1/2011 |

(Continued)

OTHER PUBLICATIONS

International Preliminary Report on Patentability Appln. No. PCT/CN2013/077355; Dated Oct. 27, 2015.
(Continued)

*Primary Examiner* — Daniel Luke
(74) *Attorney, Agent, or Firm* — Ladas & Parry LLP

(57) ABSTRACT

An array substrate includes a display area and a peripheral area adjacent to the display area; the display area includes a plurality of pixel units; each pixel unit includes a thin-film transistor (TFT) and a pixel electrode; and a drain electrode of the TFT directly contacts with the pixel electrode. In the array substrate, the drain electrode of the TFT directly
(Continued)

contacts with the pixel electrode, and hence a uniformly distributed electric field will be generated between common electrodes and the pixel electrodes.

16 Claims, 6 Drawing Sheets

(51) Int. Cl.
*G02F 1/1368* (2006.01)
*G02F 1/1337* (2006.01)
*G02F 1/1343* (2006.01)
*G02F 1/1362* (2006.01)

(52) U.S. Cl.
CPC ........ *H01L 27/127* (2013.01); *H01L 27/1225* (2013.01); *H01L 27/3248* (2013.01); *G02F 1/133707* (2013.01); *G02F 2001/134372* (2013.01); *G02F 2001/136295* (2013.01)

(56) References Cited

U.S. PATENT DOCUMENTS

| | | | | |
|---|---|---|---|---|
| 2008/0143908 A1* | 6/2008 | Bae | ............... | G02F 1/133345 349/43 |
| 2008/0158457 A1 | 7/2008 | Park et al. | | |
| 2010/0144391 A1* | 6/2010 | Chang | ............... | G02F 1/13338 455/566 |
| 2011/0006290 A1 | 1/2011 | Noh et al. | | |
| 2012/0104392 A1* | 5/2012 | Son | ............... | G02F 1/134363 257/59 |
| 2013/0056724 A1 | 3/2013 | Chae et al. | | |
| 2013/0057797 A1* | 3/2013 | Nagami | ............... | G02F 1/1368 349/46 |
| 2013/0077008 A1* | 3/2013 | Kim | ............... | G02F 1/136227 349/42 |
| 2013/0099229 A1* | 4/2013 | Wakana | ............... | H01L 29/7869 257/43 |
| 2013/0257700 A1* | 10/2013 | Chang | ............... | G02F 1/134363 345/87 |
| 2013/0307761 A1* | 11/2013 | Kwak | ............... | G09G 3/3696 345/87 |
| 2014/0184964 A1* | 7/2014 | Byeon | ............... | G02F 1/134363 349/33 |

FOREIGN PATENT DOCUMENTS

| | | |
|---|---|---|
| CN | 102983141 A | 3/2013 |
| CN | 102998866 A | 3/2013 |
| CN | 203275840 A | 11/2013 |

OTHER PUBLICATIONS

First Chinese Office Action Appln. No. 201310142870.8: Dated Jan. 29, 2015.
Second Chinese Office Action Appln. No. 201310142870.8; dated Jul. 16, 2015.

* cited by examiner

C-C

B-B

E-E

ARRAY SUBSTRATE WITH UNIFORM CHARGE DISTRIBUTION, METHOD FOR MANUFACTURING THE SAME AND DISPLAY DEVICE

TECHNICAL FIELD

Embodiments of the present disclosure relate to an array substrate, a method for manufacturing the same and a display device comprising the same.

BACKGROUND

An array substrate comprises a display area and a peripheral area adjacent to the display area; the display area comprises a plurality of pixel units; and each pixel unit is provided with a thin-film transistor (TFT) and a pixel electrode. In each pixel unit, a drain electrode of the TFT is electrically connected to the pixel electrode via a through hole. However, a large contact resistance will be generated when metals in the through hole make contact with the pixel electrode, and hence the charge distribution between a common electrode and the pixel electrode is not uniform.

Therefore, how to achieve uniform charge distribution between the common electrode and the pixel electrode is a technical problem to be solved.

SUMMARY

One object of the present disclosure is to provide an array substrate, a method for manufacturing the same and a display device comprising the same. In the array substrate, the charge distribution between common electrodes and pixel electrodes is uniform.

In order to achieve the object, in one aspect, the present disclosure provides an array substrate. The array substrate comprises a display area and a peripheral area adjacent to the display area; the display area comprises a plurality of pixel units; each pixel unit comprises a TFT and a pixel electrode; wherein a drain electrode of the TFT directly contacts with the pixel electrode.

In one example, the array substrate further comprises a common electrode line; and the pixel unit comprises a common electrode which directly contacts with the common electrode line.

In one example, the pixel electrode comprises a pixel electrode body and a connecting portion protruding from the pixel electrode body; and the connecting portion directly contacts with the drain electrode of the TFT.

In one example, the connecting portion is disposed between the drain electrode of the TFT and a gate insulation layer of the TFT.

In one example, the connecting portion covers a part of an upper surface of the drain electrode of the TFT.

In one example, an active layer of the TFT comprises a first portion, a second portion and a third portion; the first portion covers at least one part of an upper surface of a source electrode of the TFT; the second portion covers one part of an upper surface of the gate insulation layer of the TFT; and the third portion covers at least one part of the upper surface of the drain electrode of the TFT.

In one example, the peripheral area is provided with a gate line lead, a gate line lead electrode disposed on the gate line lead and electrically connected to the gate line lead, a common electrode line lead, a common electrode line lead electrode disposed on the common electrode line lead and electrically connected to the common electrode line lead, a data line lead and a data line lead electrode disposed on the data line lead and electrically connected to the data line lead; the gate line lead is electrically connected to gate line in the display area correspondingly; the common electrode line lead is electrically connected to the common electrode line in the display area correspondingly; the data line lead is electrically connected to the data line in the display area correspondingly; and the gate line lead electrode, the common electrode line lead electrode and the data line lead electrode are all electrically connected to an external drive circuit.

In one example, the gate line lead and the common electrode line lead are disposed on the same layer with the gate line and the common electrode line; and/or the data line lead is disposed on the same layer with the data line.

In one example, the active layer of the TFT is made of an oxide.

In one example, the oxide is indium gallium zinc oxide (IGZO).

In another aspect, the present disclosure further provides a display device. The display device comprises an array substrate, wherein the array substrate is the foregoing array substrate provided by the present disclosure.

In still another aspect, the present disclosure further provides a method for manufacturing an array substrate. The manufacturing method comprises the following steps:

forming a first group of patterns comprising a data line, source/drain electrodes; and forming a second group of patterns comprising a pixel electrode directly contacting to the drain electrode.

In one example, the manufacturing method further comprises the following steps in sequence:

forming a third group of patterns comprising a common electrode; and forming a fourth group of patterns comprising a common electrode line directly contacting with the common electrode.

In one example, the step of forming the third group of patterns is carried out before the step of forming the first group of patterns; the fourth group of patterns further comprises a gate electrode, a gate line, a gate line lead correspondingly connected to the gate line, and a common electrode line lead correspondingly connected to the common electrode line; and the first group of patterns further comprises a data line lead correspondingly connected to the data line.

In one example, the manufacturing method further comprises a step of forming a gate insulation layer which is carried out after the step of forming the fourth group of patterns; and the gate insulation layer covers the fourth group of patterns.

In one example, the manufacturing method further comprises the following steps carried out in sequence after the step of forming the first group of patterns:

forming patterns of an active layer, wherein the pattern of the active layer comprises a first portion, a second portion and a third portion which are connected in sequence; the first portion covers at least one part of an upper surface of the source electrode; the second portion covers one part of an upper surface of the gate insulation layer; and the third portion covers at least one part of an upper surface of the drain electrode; and forming a passivation layer.

In one example, the step of forming the second group of patterns is carried out after the step of forming the gate insulation layer; and the step of forming the first group of patterns is carried out after the step of forming the second group of patterns.

In one example, the manufacturing method further comprises the following steps carried out after the step of forming the passivation layer:

forming a first through hole, a second through hole and a third through hole in the passivation layer, wherein the first through hole, the second through hole and the third through hole all pass through the passivation layer; the first through hole is formed over the gate line leads; the second through hole is formed over the common electrode line leads; and the third through hole is formed over the data line leads; and forming a gate line lead electrode, a common electrode line lead electrode and a data line lead electrode in the passivation layer provided with the first through hole, the second through hole and the third through hole, wherein the gate line lead electrode is electrically connected to the gate line lead through the first through hole; the common electrode line lead electrode is electrically connected to the common electrode line lead through the second through hole; and the data line lead electrode is electrically connected to the data line lead through the third through hole.

In one example, the step of forming an opening portion in the passivation layer is carried out after the step of forming the passivation layer; the step of forming the second group of patterns is carried out after the step of forming the passivation layer; and the pixel electrode covers the opening portion and directly contacts with the drain electrodes.

In one example, the second group of patterns further comprises a gate line lead electrode, a common electrode line lead electrode and a data line lead electrode; the manufacturing method further comprises a step of forming a first through hole, a second through hole and a third through hole which are formed in the passivation layer and all pass through the passivation layer; the first through hole is formed over the gate line lead; the second through hole is formed over the common electrode line lead; the third through hole is formed over the data line lead; the step of forming the second group of patterns is carried out after the step of forming the first through hole, the second through hole and the third through hole, such that the gate line lead electrode is electrically connected to the gate line lead through the first through hole, the common electrode line lead electrode is electrically connected to the common electrode line lead through the second through hole; and the data line lead electrode is electrically connected to the data line lead through the third through hole.

In one example, the pixel electrode comprises a pixel electrode body and a connecting portion protruding from the pixel electrode body; and the connecting portion directly contacts with the drain electrode of the TFT.

In the array substrate provided by embodiments of the present disclosure, the pixel electrode and the TFT are not electrically connected to each other through a through hole but directly contact to each other, so that no contact resistance will be generated, and hence the charge distribution between the common electrode and the pixel electrode is be uniform.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

As illustrated in FIGS. 1 to 11, in one aspect, the present disclosure provides an array substrate. The array substrate comprises a display area and a peripheral area adjacent to the display area; the display area comprises a plurality of pixel units; and each pixel unit is provided with a TFT and a pixel electrode 20. In each pixel unit, a drain electrode 11 of the TFT directly contacts with the pixel electrode 20.

Figure 1:
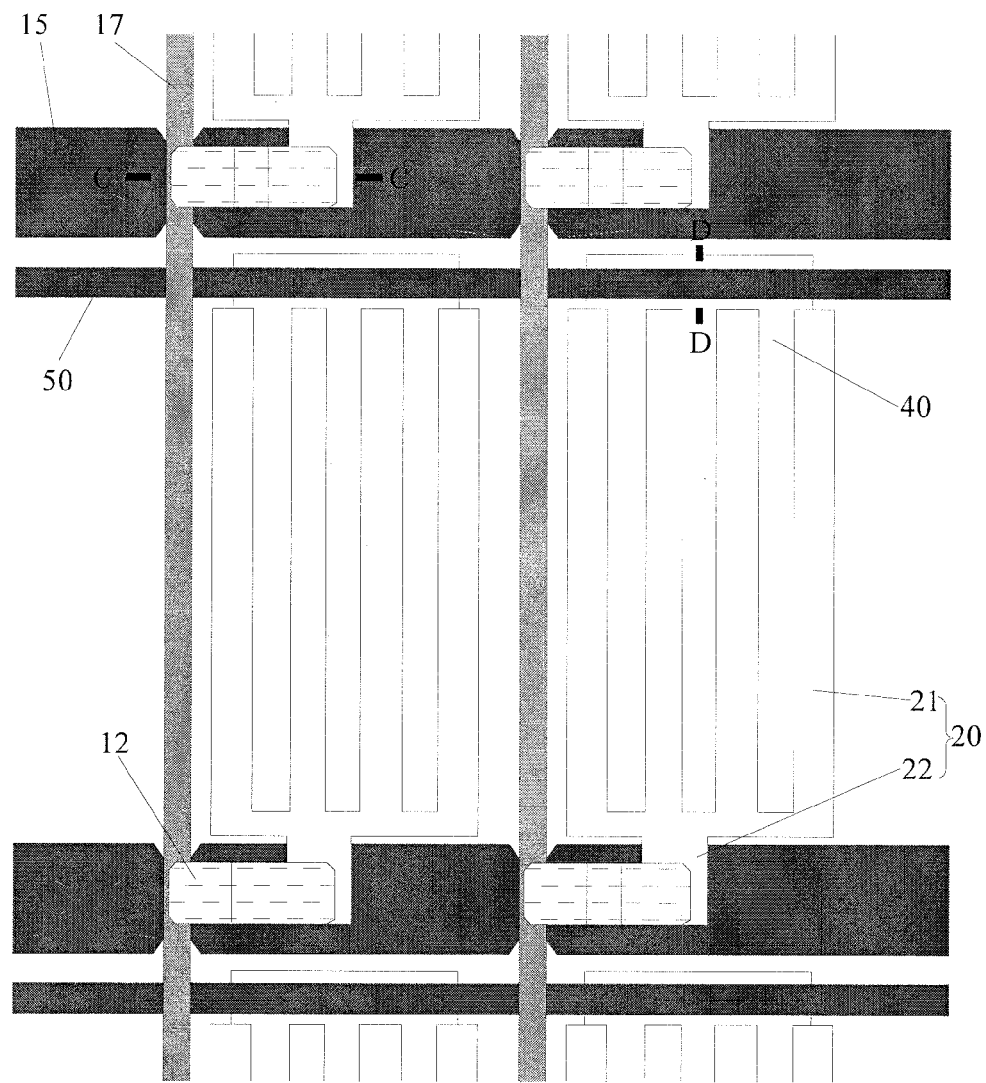
FIG. 1 is a top view of one part of a pixel unit in an array substrate according to a first embodiment of the present disclosure.

As illustrated in FIG. 1, a plurality of gate lines 15 (only two gate lines shown in the figure) and a plurality of data lines 17 (only two data lines shown in the figure) are intercrossed to divide the display area into a plurality of pixel units. Common electrodes 40 are disposed in the pixel units; and the common electrodes 40 in the same row are connect to with each other in series by a common electrode line 50 which supplies power to the common electrodes 40 in the same row.

In the embodiment, one part of the gate line 15 also serves as a gate electrode of the TFT. Of course, the array substrate according to the embodiment of the present disclosure may further comprise independent gate lines and gate electrodes which are connected to each other. As the pixel electrode 20 directly contacts with the drain electrode 11 of the TFT, no contact resistance will be generated between the pixel electrode 20 and the drain electrode 11 of the TFT. It should be understood that the difference between the "directly contacting with" herein and the "connecting via a through hole" lies in that: in the case of the drain electrode 11 "directly contacting" the pixel electrode 20, the pixel electrode 20 has uniform thickness; but in the case that the drain electrode 11 and the pixel electrode 20 are "connected via a through hole", a projection is formed on the pixel electrode 20 and fitted with the through hole, and the "projection" herein is a main part for generating the contact resistance. In the embodiment of the present disclosure, no "projection" is formed on the pixel electrode, and hence no contact resistance will be generated. In the case of no contact resistance generated, the charge distribution on the pixel electrode 20 is relatively uniform.

In the array substrate, a peripheral circuit is disposed in the peripheral area and configured to electrically connect the pixel units in the display area to an external drive circuit so as to provide signals to the pixel units in the display area.

Figure 3:
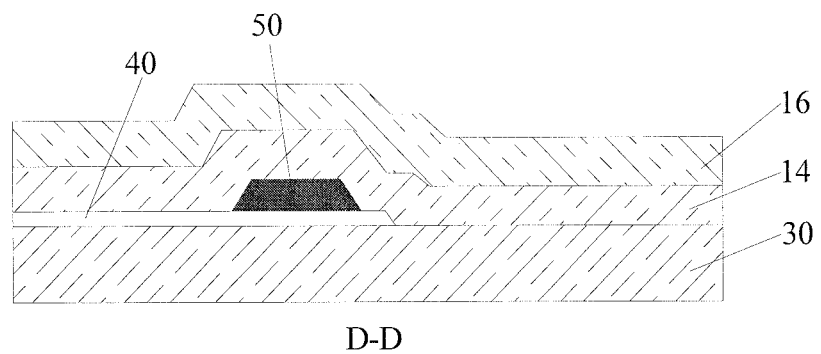
FIG. 3 is a sectional view of FIG. 1 taken along D-D.
Figure 4:
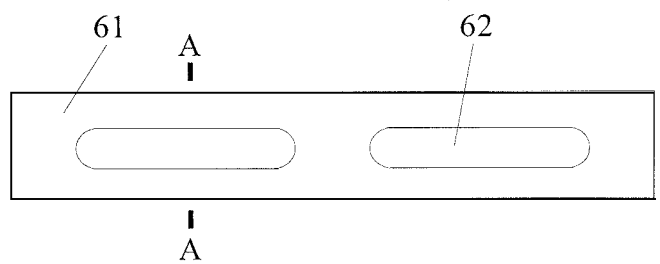
FIG. 4 is a top view of one part of a peripheral area of the array substrate according to the first embodiment of the present disclosure.
Figure 11:
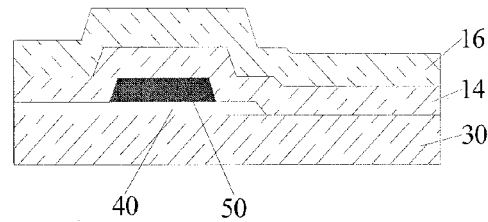
FIG. 11 is a sectional view of FIG. 9 taken along F-F.

The array substrate further comprises common electrodes 40 matched with the pixel electrodes 20. In embodiments of the present disclosure, as illustrated in FIGS. 3 and 11, the common electrodes 40 directly contacts with the common electrode lines 50. Similarly, no contact resistance will be generated between the common electrode 40 and the common electrode line 50. Therefore, the charge distribution on the common electrode 40 is also relatively uniform.

Therefore, a uniform electric field can be generated between the pixel electrode 20 and the common electrode 40.

Figure 2:
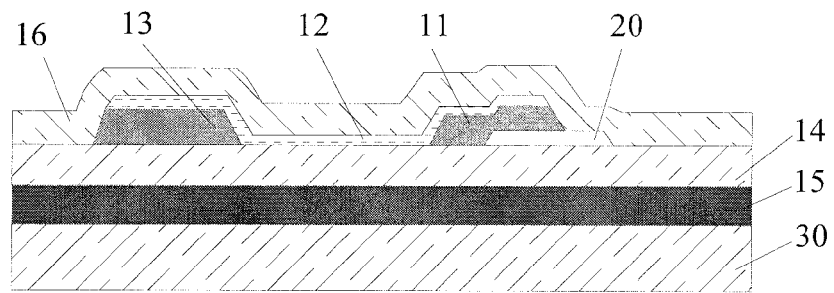
FIG. 2 is a sectional view of FIG. 1 taken along C-C.
Figure 8:
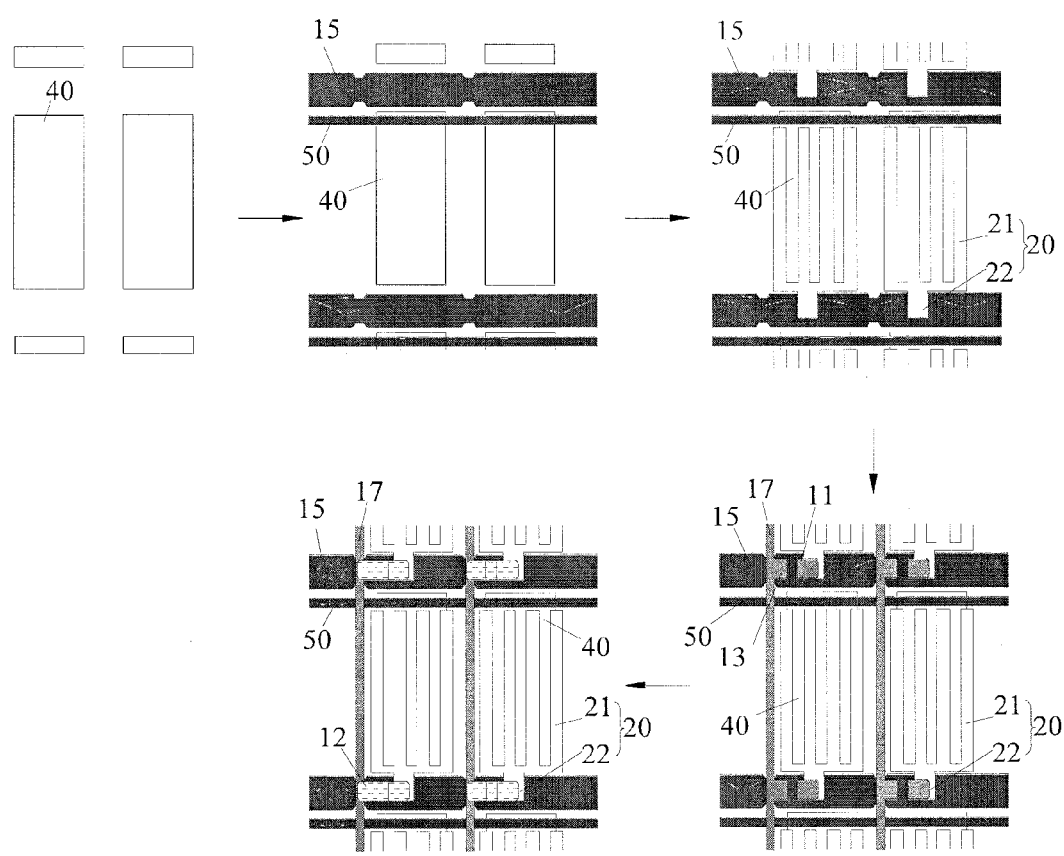
FIG. 8 is a process flowchart for manufacturing the array substrate as shown in FIG. 1.

In the first embodiment of the present disclosure, as illustrated in FIGS. 1 and 2, the pixel electrode 20 comprises a pixel electrode body 21 and a connecting portion 22 protruding from the pixel electrode body 21; and the connecting portion 22 is disposed between the drain electrode 11 and a gate insulation layer 14 of the TFT. The pixel electrode 20 of this manner can be formed by the process steps as illustrated in FIG. 8. The method for manufacturing the array substrate according to the first embodiment will be further described below, and it is not elaborated here.

Figure 9:
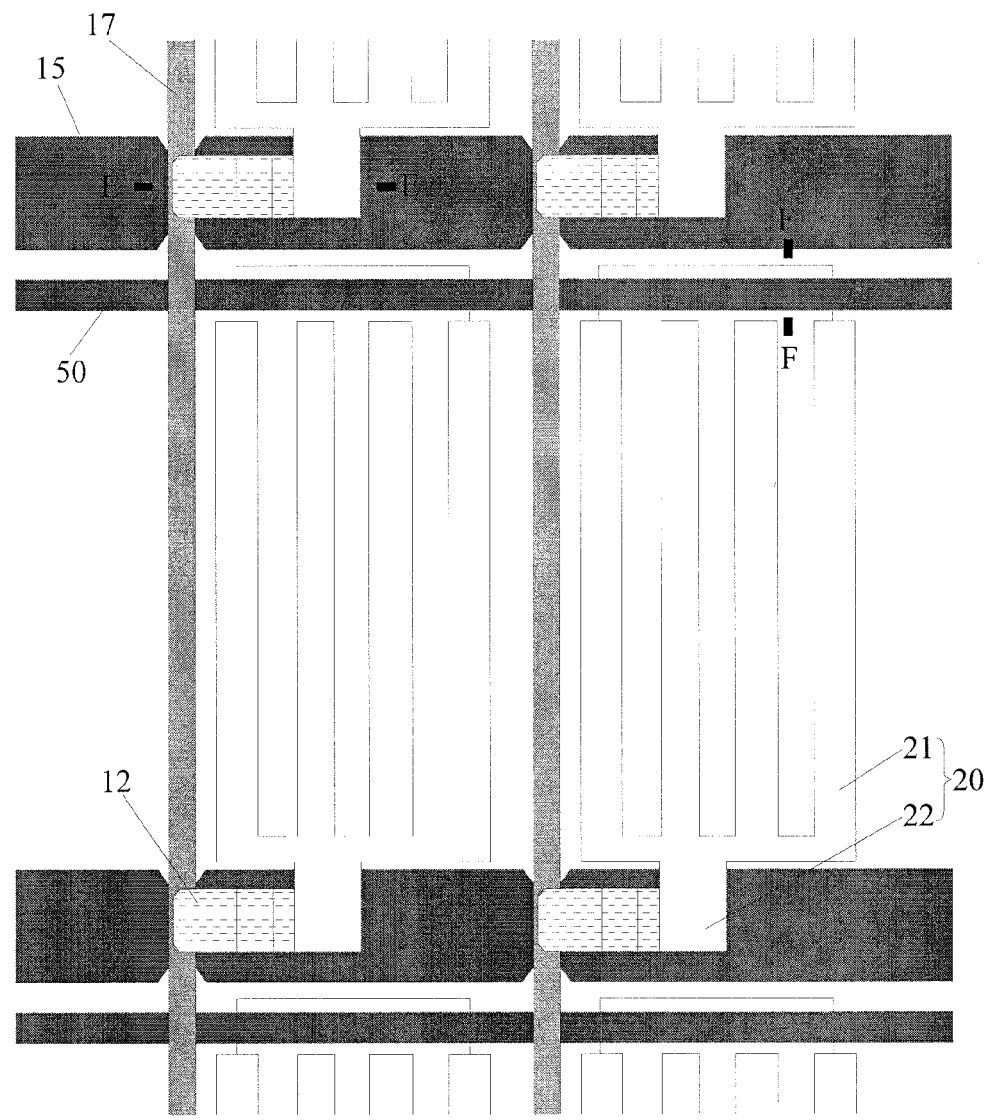
FIG. 9 is a top view of one part of a pixel unit of an array substrate according to a second embodiment of the present disclosure.
Figure 10:
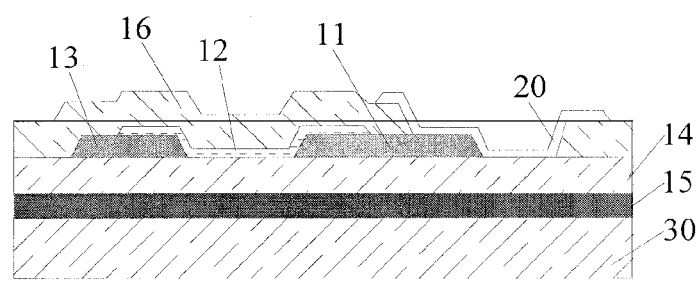
FIG. 10 is a sectional view of FIG. 9 taken along E-E.

In a second embodiment of the present disclosure, as illustrated in FIGS. 9 and 10, the pixel electrode 20 comprises a pixel electrode body 21 and a connecting portion 22 protruding from the pixel electrode body 21; and the connecting portion 22 covers one part of an upper surface of the drain electrode of the TFT. Similarly, the method for manufacturing the array substrate according to the second embodiment will be further described below, and it is not elaborated here.

In the array substrate according to the embodiment of the present disclosure, as illustrated in FIGS. 4 to 7, a peripheral circuit is disposed in the peripheral area and comprises gate line leads 63, gate line lead electrodes 61 disposed over the gate line leads 63 and electrically connected to the gate line leads 63, common electrode line leads (not shown), common electrode line lead electrodes (not shown) disposed over the common electrode line leads and electrically connected to the common electrode line leads, data line leads 73 and data line lead electrodes 71 disposed over the data line leads 73 and electrically connected to the data line leads 73; the gate line leads 63 are electrically connected to the gate lines 15 in the display area in one-to-one correspondence; the common electrode line leads are electrically connected to the common electrode lines 50 in the display area in one-to-one correspondence; the data line leads 73 are electrically connected to the data lines 17 in the display area in one-to-one correspondence; and the gate line lead electrodes 61, the common electrode line lead electrodes and the data line lead electrodes 71 are all electrically connected to an external drive circuit. The display area can be supplied with power after the gate line lead electrodes 61, the common electrode line lead electrodes and the data line lead electrodes 71 are connected to the external drive circuit.

In the embodiment of the present disclosure, there is not specific requirement on the electrical connection means between the gate line leads 63 and the gate line lead electrodes 61, the electrical connection means between the common electrode line leads and the common electrode line lead electrodes, and the electrical connection means between the data line leads 73 and the data line lead electrodes 71. For instance, through holes can be used as an electrical connection. Of course, the gate line leads 63 can directly contact with the gate line lead electrodes 61; the common electrode line leads can directly contact with the common electrode line lead electrodes; and the data line leads 73 can directly contact with the data line lead electrodes 71. Mannes for directly contacting will be further described below, and it is not elaborated here.

Figure 5:
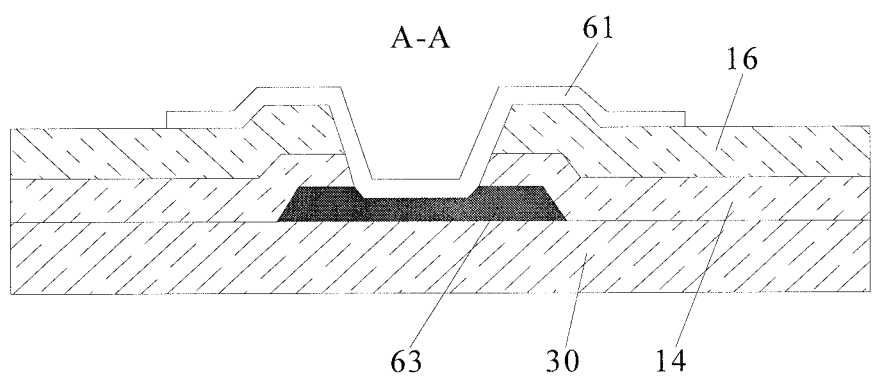
FIG. 5 is a sectional view of FIG. 4 taken along A-A.
Figure 6:
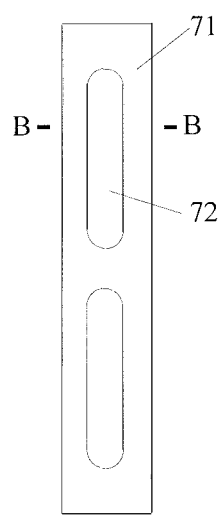
FIG. 6 is a top view of another part of the peripheral area of the array substrate according to the first embodiment of the present disclosure.
Figure 7:
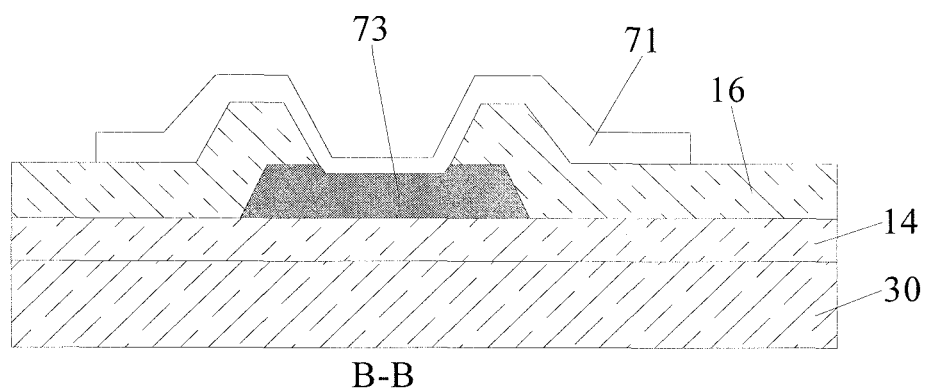
FIG. 7 is a sectional view of FIG. 6 taken along B-B.

It should be understood by those skilled in the art that the term "on", "over" or "above" herein is illustrated by referring the vertical direction in FIGS. 5 and 7.

The peripheral area can supply power to the pixel units in the display area.

For easy manufacturing, in the embodiment of the present disclosure, the gate line leads 63 and the common electrode line leads can be disposed on the same layer with the gate lines 15 and the common electrode lines 50. Similarly, the data line leads 73 may be disposed on the same layer with the data lines 17.

In the embodiment of the present disclosure, there is no special requirement on the specific structure of the TFT. For instance, the TFT may be an etch barrier type TFT. In such a TFT, an active layer 12 is disposed below a source electrode 13 and a drain electrode 11; and an etch barrier layer is formed on the active layer 12, so that the active layer 12 cannot be damaged when forming the source electrode 13 and the drain electrode 11.

The TFT may also be a back-channel-etch (BCE) type TFT, in which the active layer 12 is disposed beneath the source electrode 13 and the drain electrode 11. The manufacturing process of such a TFT is relatively simple.

In one example, the TFT may be a coplanar type TFT. As illustrated in FIG. 2, an active layer 12 of the TFT comprises a first portion, a second portion and a third portion; the first portion covers at least one part of an upper surface of a source electrode 13 of the TFT; the second portion covers one part of an upper surface of a gate insulation layer 14 of the TFT; and the third portion covers at least one part of an upper surface of a drain electrode 11 of the TFT. It should be understood that the term "upper" used here is illustrated by referring the vertical direction in FIG. 2. As the active layer 12 is disposed above the source electrode 13 and the drain electrode 11, the active layer 12 cannot be damaged when forming the source electrode 13 and the drain electrode 11. Moreover, compared with the etch barrier type TFT, the manufacturing process of the coplanar type TFT is simpler.

For instance, the active layer 12 of the TFT is made of an oxide. The TFT with an active layer made of oxide has a high migration rate.

More specifically, the oxide may comprise IGZO. The IGZO not only allows the TFT to have a high migration rate but also has various advantages, such as high uniformity, transparency, simple manufacturing process and the like, and can better satisfy requirements of large-size liquid crystal displays (LCD) and active organic light-emitting diode (OLED) devices.

In another aspect, the present disclosure provides a display device. The display device comprises an array substrate, wherein the array substrate is the foregoing array substrate according to embodiments of the present disclosure.

In the display device, as the pixel electrode 20 of the array substrate directly contacts with the drain electrode 11 of the TFTs, no contact resistance will be generated. Moreover, as the common electrode 40 directly contacts with the common electrode line 50, no contact resistance will be generated between the common electrode 40 and the common electrode line 50. Therefore, uniform electric fields can be generated between the common electrode 40 and the pixel electrode 20 of the array substrate, and hence the display device has good display effect. In an embodiment of the present disclosure, the display device is an LCD device.

Figure 12:
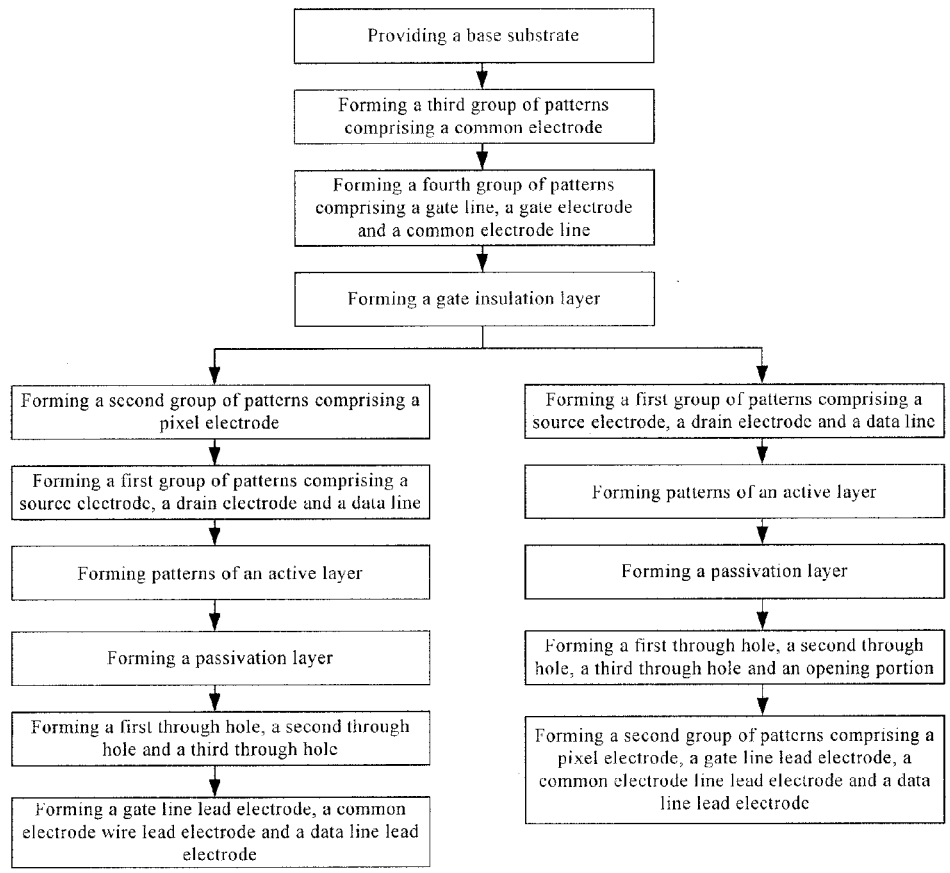
FIG. 12 is a process flowchart of a method for manufacturing an array substrate according to the present disclosure.

In still another aspect, the present disclosure further provides a method for manufacturing an array substrate. As illustrated in FIG. 12, the manufacturing method comprises the following steps:

forming a first group of patterns comprising a data line 17, a source electrode 13 and a drain electrode 11; and forming a second group of patterns comprising a pixel electrode 20 directly contacting with the drain electrodes 11.

It should be noted that the array substrate further comprises a base substrate 30 and both the first group of patterns and the second group of patterns are formed on the base substrate 30. Moreover, there is not special requirement on the order of the step of forming the first group of patterns and the step of forming the second group of patterns in the embodiment of the present disclosure, and which step is to be carried out firstly must be determined by the specific structure of the array substrate to be formed.

It should be understood by those skilled in the art that the display area of the array substrate comprises a plurality of pixel units and each pixel unit comprises a TFT and a pixel electrode 20. Herein, the source electrode 13 refers to the source electrode of the TFT, and the drain electrode 11 refers to the drain electrode of the TFT.

In an embodiment of the present disclosure, the first group of patterns is formed as follows: a film layer is formed firstly and then the first group of patterns is formed by a patterning process. The film layer may be formed by means of deposition, coating, sputtering or the like, and the method for forming the film layer may be selected on the basis of the specific material of the film layer. The patterning process generally comprises photoresist coating, exposure, development, etching, photoresist peeling and other steps. It should be understood that the process of forming the first group of patterns is not limited to the above processes, and the first group of patterns can be also formed by other processes such as transfer printing.

The step of forming the second group of patterns is similar to the step of forming the first group of patterns. No further description will be set forth here.

In the embodiment according to the present disclosure, the common electrodes 40 and the pixel electrodes 20 are disposed on the same base substrate 30. Therefore, the method for manufacturing the array substrate further comprises the following steps in sequence:

forming a third group of patterns comprising the common electrodes 40; and forming a fourth group of patterns comprising the common electrode lines 50 directly contacting with the common electrodes 40.

In general, the common electrodes 40 directly contacts with the base substrate 30. Therefore, in the process of manufacturing the array substrate, the step of forming the third group of patterns is carried out firstly.

It should be understood by those skilled in the art that the step of forming the third group of patterns is not necessary in manufacturing the array substrate. In some display devices, the common electrodes are disposed on the array substrate. Then, the step of forming the third group of patterns is required. The display device according to the embodiment of the present disclosure has such a structure. But in some display devices, the common electrodes are disposed on a color filter substrate (an opposite substrate). Thus, the step of forming the third group of patterns is not required in the process of manufacturing the array substrate.

For easy manufacturing, the fourth group of patterns further comprises a gate electrode, a gate line 15, a gate line lead 63 electrically connected with the gate line 15 correspondingly, and a common electrode line lead a electrically connected to the common electrode line 50 correspondingly; and the first group of patterns further comprises a data line lead 73 electrically connected with the data line 17 correspondingly. In the embodiment according to the present disclosure, one part of the gate line 15 serves as a gate electrode of a TFT. A plurality of gate lines 15 are provided; a plurality of data lines 17 are provided; and the gate lines 15 and the data lines 17 are intercrossed to divide the base substrate 30 of the array substrate into a plurality of pixel units. As described above, the array substrate further comprises a peripheral area adjacent to the display area, and the gate line lead 63, the common electrode line lead and the data line lead 73 are one part of a peripheral circuit disposed in the peripheral area. As the functions of the gate line lead 63, the common electrode line lead and the data line lead 73 have been introduced above, no further description will be set forth here.

In general, the method for manufacturing the array substrate further comprises the step of forming a gate insulation layer which is carried out after the step of forming the fourth group of patterns. The gate insulation layer 14 covers the fourth group of patterns.

Both the TFTs in the array substrates according to the first embodiment and the second embodiment of the present disclosure are coplanar type TFTs. Therefore, the method for manufacturing the array substrate further comprises the following steps carried out in sequence after the step of forming the first group of patterns:

forming patterns of an active layer 12, in which the active layer 12 comprises a first portion, a second portion and a third portion which are connected in sequence; the first portion covers at least one part of an upper surface of the source electrode 13; the second portion covers one part of an upper surface of the gate insulation layer 14; and the third portion covers at least one part of the upper surface of the drain electrode 11; and forming a passivation layer 16.

In the process of manufacturing the array substrate as shown in FIGS. 1 to 8, the step of forming the gate insulation layer must be carried out firstly and hence the step of forming the second group of patterns is carried out; and the step of forming the first group of patterns is carried out after the step of forming the second group of patterns (as illustrated in FIG. 8, but FIG. 8 only illustrates the sequence of partial steps). Manufacturing an array substrate in the above sequence allows one part of the pixel electrode 20 to be disposed between the gate insulation layer 14 and the drain electrode 11.

In this case, the passivation layer 16 is disposed above the pixel electrodes 20. Therefore, the manufacturing method further comprises the following steps carried out after the step of forming the passivation layer:

forming a first through hole 62, a second through hole and a third through hole 72 on the passivation layer 16, in which the first through hole 62, the second through hole and the third through hole 72 all pass through the passivation layer 16; the first through hole 62 is formed over the gate line lead 63; the second through hole is formed over the common electrode line lead; and the third through hole 72 are formed over the data line lead 73; and forming a gate line lead electrode 61, a common electrode line lead electrode and data line lead electrode 71 in the passivation layer 16, wherein the gate line lead electrode 61 is electrically connected to the gate line lead 63 through the first through hole 62; the common electrode line lead electrode is electrically connected to the common electrode line lead through the second through hole; and the data line lead electrode 71 is electrically connected to the data line lead 73 through the third through hole 72. The gate line lead electrode 61, the common electrode line lead electrode and the data line lead electrode 71 are also one part of the peripheral circuit. As detailed description has been given above, no further description will be given here.

It should be understood that the formed first through hole 62 should reach the gate line lead 63, that is to say, the first through hole 62 not only should pass through the passivation layer 16 but also should pass through the gate insulation layers 14. Similarly, the second through hole should also reach the common electrode line lead. As the common electrode line lead and the gate line lead 63 are disposed on the same layer, the second through hole should also pass through the gate insulation layers 14. Similarly, the third through hole 72 should also reach the data line lead 73. In the embodiment of the present disclosure, the data line lead 73 are disposed above the gate insulation layers, so that the third through hole 72 pass through the passivation layer 16.

In the present disclosure, the first through hole 62 should have enough cross-sectional area so that the thickness of a portion of the gate line lead electrode 61 disposed in the first through hole 62 can be equal to that of a portion of the gate line lead electrode 61 disposed outside the first through hole 62. Thus, no contact resistance will be generated between the gate line lead electrode 61 and the gate line lead 63.

Similarly, the second through hole should also have enough cross-sectional area so that the thickness of a portion of the common electrode line lead disposed in the second through hole can be equal to that of a portion of the common electrode line lead disposed outside the second through hole.

Similarly, the third through hole 72 should also have enough cross-sectional area so that the thickness of a portion of the data line lead 73 disposed in the third through hole 72 can be equal to that of a portion of the data line lead 73 disposed outside the third through hole 72.

Of course, the gate line lead electrode 61 can also be electrically connected to the gate line lead 63 via a through hole; the common electrode line lead electrode can also be electrically connected to the common electrode line lead via a through hole; and the data line lead electrode 71 can also be electrically connected to the data line lead 73 via a through hole.

To sum up, the sequence of the steps (as shown by the right part of FIG. 12) of the manufacturing method according to the first embodiment of the present disclosure is as follows: the step of providing the base substrate; the step of forming the fourth group of patterns; the step of forming the gate insulation layer; the step of forming the second group of patterns; the step of forming the first group of patterns; the step of forming the patterns of the active layer; the step of forming the passivation layer; the step of forming the first through hole, the second through hole and the third through hole; and the step of forming the gate line lead electrodes, the common electrode line lead electrode and the data line lead electrode. The process of manufacturing the array substrate according to the first embodiment of the present disclosure requires seven patterning process steps. The array substrate as illustrated in FIGS. 1 to 7 can be obtained by means of the manufacturing method.

In manufacturing the array substrate as illustrated in FIGS. 9 to 11, the step of forming the second group of patterns can be carried out after the step of forming the passivation layer. Of course, the passivation layer 16 formed in the step of forming the passivation layer should be provided with an opening portion; and the pixel electrode 20 formed in the step of forming the second group of patterns directly contacts with the drain electrode 11 by covering the opening portion. It should be noted that the "opening portion" herein must have large cross-sectional area so that the thickness of one part of the pixel electrode 20 covering the opening portion can be equal to that of other parts of the pixel electrode 20. As described above, as the opening portion has large cross-sectional area, the passivation layer provided with the opening portion can be directly formed; or the opening portion is provided in the passivation layer 16 after the passivation layer 16 being formed.

Similarly, in the second embodiment as illustrated in FIGS. 9 to 11, the second group of patterns can further comprise a gate line lead electrode, a common electrode line lead electrode and a data line lead electrode. In order to simplify the manufacturing process of the array substrate, for example, the second group of patterns can further comprise a gate line lead electrode, the common electrode line lead electrode and the data line lead electrode, namely the gate line lead electrode, the common electrode line lead electrode and the data line lead electrode can be formed at the same time when forming the pixel electrode 20.

Therefore, in the second embodiment of the present disclosure, the manufacturing method further comprises the step of forming a first through hole, a second through hole and a third through hole which are formed in the passivation layer and all pass through the passivation layer; the first through hole is formed on the gate line lead; the second through hole is formed on the common electrode line lead; the third through hole is formed on the data line lead; the step of forming the second group of patterns is carried out after the step of forming the first through hole, the second through hole and the third through hole, so that the gate line lead electrode is electrically connected to the gate line lead through the first through hole; the common electrode line lead electrode is electrically connected to the common electrode line lead through the second through hole; and the data line lead electrode is electrically connected to the data line lead through the third through hole.

Similar to the first embodiment, it should be understood that the first through hole should not only pass through the passivation layer 16 but also pass through the gate insulating layer 14; the second through hole should not only pass through the passivation layer 16 but also pass through the gate insulating layer 14; and the third through hole pass through the passivation layer 16.

The forming manner and the cross-sectional area of the first through hole, the second through hole and the third through hole can be the same with those in the first embodiment. It will not be described again here. In the embodiment, the opening portions can be formed at the same time as the first through hole, the second through hole and the third through hole are formed.

In summary, a sequence of the steps (as illustrated by the right part of FIG. 12) of the manufacturing method according to the second embodiment of the present disclosure is as follows: the step of providing the base substrate; the step of forming the third group of patterns; the step of forming the fourth group of patterns; the step of forming the gate insulation layer; the step of forming the first group of patterns; the step of forming the patterns of the active layer; the step of forming the passivation layer; the step of forming the first through hole, the second through hole, the third through hole and the opening portion; and the step of forming the second group of patterns. The manufacturing process of the array substrate according to the second embodiment of the present disclosure requires six patterning processing steps. The array substrate as illustrated in FIGS. 9 to 11 can be obtained by the method.

It can be seen that, compared with the first embodiment, the manufacturing method according to the second embodiment saves one step of photolithography technique.

It should be understood that the pixel electrode 20 formed in the step of forming the second group of patterns comprises a pixel electrode body 21 and a connecting portion 22 protruding from the pixel electrode body, and the connecting portion 22 directly contacts with the drain electrode 11.

The method for manufacturing the array substrate according the embodiments of the disclosure has simple processing steps, and a relatively uniform electric fields can be formed between the common electrode 40 and the pixel electrode 20 in the manufactured array substrate.

The foregoing are merely exemplary embodiments of the invention, but are not used to limit the protection scope of the invention. The protection scope of the invention shall be defined by the attached claims.

The invention claimed is:

1. An array substrate, comprising a display area and a peripheral area adjacent to the display area, the display area comprising a plurality of pixel units, each pixel unit comprising a thin-film transistor (TFT) and a pixel electrode, wherein a drain electrode of the TFT directly contacts with the pixel electrode, wherein the pixel electrode comprises a pixel electrode body and a connecting portion protruding from the pixel electrode body, and the connecting portion directly contacts with the drain electrode of the TFT; and wherein the peripheral area is provided with a gate line lead, a gate line lead electrode disposed over the gate line lead and electrically connected to the gate line lead, a common electrode line lead, a common electrode line lead electrode disposed over the common electrode line lead and electrically connected to the common electrode line lead, a data line lead and a data line lead electrode disposed over the data line lead and electrically connected to the data line lead; the gate line lead is electrically connected to a gate line in the display area correspondingly; the common electrode line lead is electrically connected to a common electrode line in the display area correspondingly: the data line lead is electrically connected to a data line in the display area correspondingly; and the gate line lead electrode, the common electrode line lead electrode and the data line lead electrode are all designed to be electrically connected to an external drive circuit.

2. The array substrate according to claim 1, further comprising a common electrode line, the pixel unit comprising a common electrode directly contacting with the common electrode line.

3. The array substrate according to claim 1, wherein the connecting portion is disposed between the drain electrode and a gate insulation layer of the TFT.

4. The array substrate according to claim 1, wherein the connecting portion covers one part of an upper surface of the drain electrode of the TFT.

5. The array substrate according to claim 1, wherein an active layer of the TFT comprises a first portion, a second portion and a third portion, the first portion covers at least one part of an upper surface of a source electrode of the TFT, the second portion covers one part of an upper surface of a gate insulation layer of the TFT, and the third portion covers at least one part of an upper surface of a drain electrode of the TFT.

6. The array substrate according to claim 1, wherein the gate line lead and the common electrode line lead are disposed on the same layer with the gate line and the common electrode line; or the data line lead is disposed on the same layer with the data line.

7. The array substrate according to claim 5, wherein the active layer of the TFT is made of an oxide.

8. The array substrate according to claim 7, wherein the oxide is indium gallium zinc oxide (IGZO).

9. A display device, comprising an array substrate according to claim 1.

10. A method for manufacturing an array substrate, the array substrate comprising a display area and a peripheral area adjacent to the display area, the method comprising the following steps:

forming a first group of patterns comprising a data line, a source electrode, a drain electrode and a data line lead correspondingly connected to the data line; and forming a second group of patterns comprising a pixel electrode directly contacting with the drain electrode:

wherein the pixel electrode comprises a pixel electrode body and a connecting portion protruding from the pixel electrode body, and the connecting portion directly contacts with the drain electrode of the TFT;

the method further comprising the following steps in sequence:

forming a third group of patterns comprising a common electrode; and forming a fourth group of patterns comprising a common electrode line directly contacting with the common electrode, the fourth group of patterns further comprises a gate electrode, a gate line, a gate line lead correspondingly connected to the gate line, and a common electrode line lead correspondingly connected to the common electrode line, the gate line lead, the common electrode line lead and the data line lead disposed in the peripheral area;

after forming the first group of patterns, the method further comprising forming an active layer and a passivation layer;

forming a first through hole, a second through hole and a third through hole in the passivation layer, in which the first through hole, the second through hole and the third through hole all pass through the passivation layer: the first through hole is formed on the gate line lead; the second through hole is formed on the common electrode line lead; and the third through hole is formed on the data line lead; and forming a gate line lead electrode, a common electrode line lead electrode and a data line lead electrode in the passivation layer provided with the first through hole, the second through hole and the third through hole, in which the gate line lead electrode is electrically connected to the gate line lead through the first through hole; the common electrode line lead electrode is electrically connected to the common electrode line lead through the second through hole; and the data line lead electrode is electrically connected to the data line lead through the third through hole.

11. The manufacturing method according to claim 10, wherein the step of forming the third group of patterns is carried out before the step of forming the first group of patterns.

12. The manufacturing method according to claim 11, further comprising a step of forming a gate insulation layer which is carried out after the step of forming the fourth group of patterns, the gate insulation layer covering the fourth group of patterns.

13. The manufacturing method according to claim 12, wherein the pattern of the active layer comprises a first portion, a second portion and a third portion which are connected in sequence; the first portion covers at least one part of an upper surface of the source electrode; the second portion covers one part of an upper surface of the gate insulation layer; and the third portion covers at least one part of an upper surface of the drain electrode.

14. The manufacturing method according to claim 13, wherein the step of forming the second group of patterns is carried out after the step of forming the gate insulation layer; and the step of forming the first group of patterns is carried out after the step of forming the second group of patterns.

15. The manufacturing method according to claim 13, wherein a step of forming an opening portion in the passivation layer is carried out after the step of forming the passivation layer; the step of forming the second group of patterns is carried out after the step of forming the passivation layer; and the pixel electrode covers the opening portion and directly contacts with the drain electrode.

16. The manufacturing method according to claim 15, wherein the second group of patterns further comprises the gate line lead electrode, the common electrode line lead electrode and the data line lead electrode; and the step of forming the second group of patterns is carried out after the step of forming the first through hole, the second through hole and the third through hole.

* * * * *